(12) United States Patent
Wyrebek et al.

(10) Patent No.: US 10,959,355 B2
(45) Date of Patent: Mar. 23, 2021

(54) STRUCTURE SHIELDING WALLPAPER

(71) Applicant: Swift Textile Metalizing LLC, Bloomfield, CT (US)

(72) Inventors: Bryan T. Wyrebek, Bristol, CT (US); Alexander T. Smith, Simsbury, CT (US); Jared D G Butlin, Longmeadow, CT (US)

(73) Assignee: SWIFT TEXTILE METALIZING LLC, Bloomfield, CT (US)

( * ) Notice: Subject to any disclaimer, the term of this patent is extended or adjusted under 35 U.S.C. 154(b) by 256 days.

(21) Appl. No.: 16/054,359

(22) Filed: Aug. 3, 2018

(65) Prior Publication Data

US 2019/0045672 A1 Feb. 7, 2019

Related U.S. Application Data

(60) Provisional application No. 62/541,376, filed on Aug. 4, 2017.

(51) Int. Cl.
| | |
|---|---|
| H05K 9/00 | (2006.01) |
| D21H 27/20 | (2006.01) |
| D21H 21/34 | (2006.01) |
| D21H 19/82 | (2006.01) |
| D21H 19/02 | (2006.01) |
| D21H 19/58 | (2006.01) |
| B32B 37/12 | (2006.01) |

(52) U.S. Cl.
CPC .......... *H05K 9/0003* (2013.01); *D21H 19/02* (2013.01); *D21H 19/58* (2013.01); *D21H 19/82* (2013.01); *D21H 21/34* (2013.01); *D21H 27/20* (2013.01); *B32B 37/12* (2013.01); *B32B 2037/1269* (2013.01); *B32B 2250/02* (2013.01); *B32B 2307/202* (2013.01); *B32B 2307/3065* (2013.01); *B32B 2571/02* (2013.01); *B32B 2607/02* (2013.01)

(58) Field of Classification Search
CPC ...... H05K 9/0003; H05K 9/0005; H05K 9/00; D21H 27/30; D21H 27/36; D21H 27/10; D21H 21/14; D21H 21/16; D21H 21/34; D21H 19/02; D21H 19/06; D21H 19/58; D21H 19/48; D21H 19/82; D21H 13/50; B32B 2037/1269; B32B 2250/02; B32B 2307/202; B32B 2307/3065; B32B 2607/02; B32B 37/12; B32B 5/18; B32B 29/00; C08L 2666/32; Y10T 428/2857; Y10T 428/2852
USPC ............ 442/228; 428/355 R, 356, 407, 920, 428/315.9; 361/818; 174/350; 427/377
See application file for complete search history.

(56) References Cited

FOREIGN PATENT DOCUMENTS

| CN | 106566433 | * | 4/2017 |
|---|---|---|---|
| JP | 2006-222197 | * | 8/2006 |

* cited by examiner

*Primary Examiner* — Camie S Thompson
(74) *Attorney, Agent, or Firm* — Baker & McKenzie

(57) ABSTRACT

An electromagnetic wave shielding wallpaper is described. The wallpaper includes a conductive layer having a base material and a conductive material, and an adhesive layer. The wallpaper may include a protective layer disposed on a first side of the conductive layer, a fire retardant layer disposed on a second side of the conductive layer, and the adhesive layer disposed on the fire retardant layer.

16 Claims, 8 Drawing Sheets

STRUCTURE SHIELDING WALLPAPER

CROSS REFERENCE TO RELATED APPLICATION

The present application claims priority to U.S. Provisional Application No. 62/541,376, filed Aug. 4, 2017, the entire contents of which is incorporated herein for all purposes by this reference.

BACKGROUND

Electromagnetic waves are often emitted from electric wires and electronic products as a byproduct of their daily function. In modern society, where wireless communication devices, power systems, home appliances, high-frequency equipment and many other emitting devices are ubiquitous, electromagnetic waves can be found in all parts of the world.

The adverse effect of electromagnetic waves on computers and the human body have become more than mere theory in recent years. To address this issue, shielded rooms were first introduced in the 1950s in response to the military's need to protect sensitive installations. The first solutions were almost exclusively made up of welded sheet steel vaults and modular clamped panel "room inside a room" installations. This design was inherently very expensive due to the high material cost and high installation cost related to the structural reinforcement required to support the heavy load. NSA introduced foil type shielding systems in the 1970s that provided a cheaper alternative to the sheet steel and modular shielding options. However, the foils were structurally weak, and shielding failure would suddenly occur due to the proclivity of foils to rip and tear as a result of normal building settling and/or tremor activity. In the 1990s, conductive paints and several conductive fabric based solutions entered the market to further reduce the cost of shielding. These materials each had their own drawbacks, where conductive paint's effectiveness was too highly dependent on difficult-to-verify thickness of the paint while also being susceptible to cracking due to normal building settling and/or tremor activity, and conductive fabrics are deficient in many respects in providing easily applicable and low-cost shielding. Specifically, many conductive fabrics require "stud wall" installation, making installation and removal of the wallpaper exceedingly difficult. As a result, there is a growing need for an effective structure shielding product.

BRIEF SUMMARY

In one embodiment, a shielding wallpaper is described. The wallpaper includes a conductive layer having a base material and a conductive material, and an adhesive layer. The conductive layer is calendered through a first roller and a second roller, and the adhesive layer may include acrylic, rubber cement, polyurethane, epoxy, and silicone based adhesives.

In another embodiment, a shielding wallpaper is described. The wallpaper includes a conductive layer having a base material and a conductive material, a protective layer disposed on a first side of the conductive layer, a fire retardant layer disposed on a second side of the conductive layer, an adhesive layer disposed on the fire retardant layer.

DETAILED DESCRIPTION

Embodiments of a shielding wallpaper and methods for producing a shielding wallpaper are described. It is to be understood, however, that the following explanation is merely exemplary in describing the devices and methods of the present disclosure. Accordingly, any number of reasonable and foreseeable modifications, changes, and/or substitutions is contemplated without departing from the spirit and scope of the present disclosure.

Figure 1:
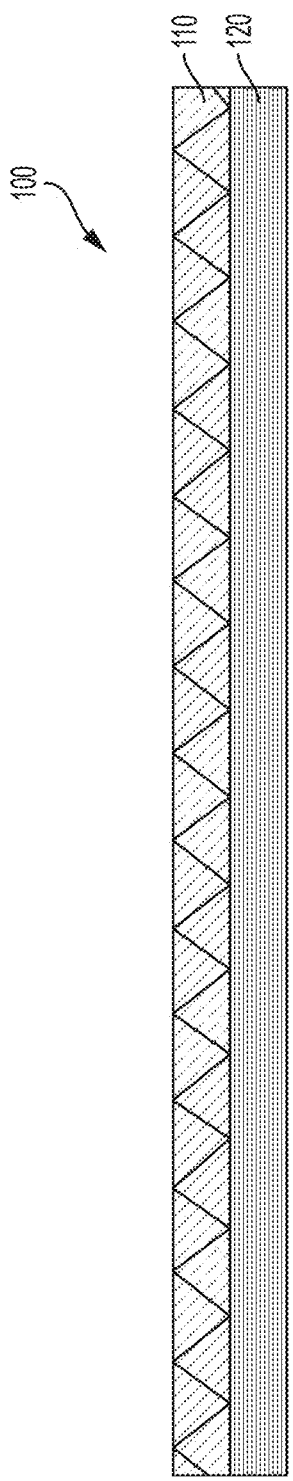
FIG. 1 shows a cross-sectional view of an embodiment of a shielding wallpaper according to the present disclosure.

FIG. 1 shows an embodiment of a shielding wallpaper 100 according to the present disclosure. The shielding wallpaper 100 may include a conductive layer 110 coupled to an adhesive layer 120. The conductive layer 110 may also be called a shielding layer, and is made up of a base material and a conductive material. Possible materials that may be used as base material include elastomers, thermoplastic polymers, cellulose fiber, carbon, fiberglass, composites, thermoset polymers, and basalt. Specific examples of base material include nylon 6, nylon 66, polyester, polyethylene, polyurethane, viton, and carbon fiber. Possible materials that may be used as conductive material include any of the intrinsically conductive polymers, metals, alloys, carbon, and metal oxides. Specific examples of conductive materials include polyaniline, graphene, carbon nanotubes, silver, nickel, and copper. The adhesive layer 120 may be a pressure sensitive, thermoplastic, multi-component, contact, thermoset, or high energy cure adhesive layer. Specific examples of the adhesive used to fabricate the adhesive layer 120 may include acrylic, rubber cement, polyurethane, epoxy, and silicone based adhesives. The adhesive layer 120 may allow the shielding wallpaper 100 to be adhered to many different types of surfaces, including but not limited to concrete, brick, dry wall, metal (e.g. aluminum, brass, copper, steel, wrought iron, etc.), glass, and wood. In an embodiment, the adhesive layer 120 is repositionable during initial installation and will gradually set to be a permanent bond to the adhered surface. In other words, the adhesive layer 120 is operable to be attached to a surface, and be detached from the surface after a short elapsed amount of time without losing a substantial amount of its adhesiveness, so that the shielding wallpaper 100 may be applied to either the same or a different surface thereafter. After an amount of time, the adhesive will form a permanent bond so that the wallpaper will not detach from the adhered surface. An advantage of having the adhesive layer 120 readily installed onto the conductive layer 110 is that it removes the need to apply each layer individually onto a desired surface.

Figure 2:
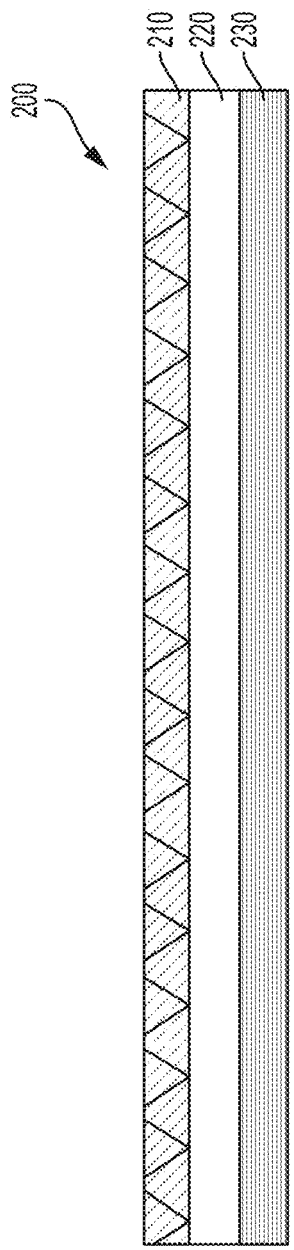
FIG. 2 shows a cross-sectional view of another embodiment of a shielding wallpaper according to the present disclosure.

FIG. 2 shows an embodiment of a shielding wallpaper 200 according to the present disclosure. The shielding wallpaper 200 may include a conductive layer 210, a fire retardant layer 220, and an adhesive layer 230. In a particular configuration, the fire retardant layer 220 is disposed between the conductive layer 210 and the adhesive layer 230. The conductive layer 210 may have the same composition and properties as the conductive layer 110 as disclosed in FIG. 1, and the adhesive layer 230 may have the same composition and properties as the adhesive layer 120 also disclosed in FIG. 1. The fire retardant layer 220 may be produced from additive type fire retardants or reactive type fire retardants. In an embodiment, the fire retardant layer 220 may include a mineral (e.g. aluminum hydroxide, borates, hydrates, etc.), organohalogen (e.g. organobromines, organochlorines, brominated polystyrenes, etc.), or an organophorous material (e.g. organophosphates, phosphonates, phosphinates, etc.). By including a fire retardant layer into the RF wave/electromagnetic wave shielding wallpaper 200, the wallpaper is enhanced so as to be able to meet fire retardant regulations. When such a shielding wallpaper 200 is applied to a wall, the fire code requirement can continue to be met, and the wallpaper 200 may further provide shielding from RF and electromagnetic waves.

Figure 3:
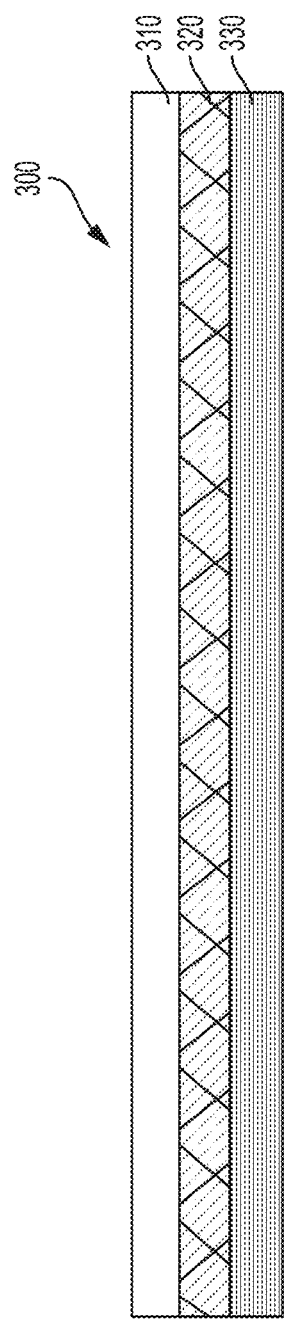
FIG. 3 shows a cross-sectional view of another embodiment of a shielding wallpaper according to the present disclosure.

FIG. 3 shows an embodiment of a shielding wallpaper 300 according to the present disclosure. The shielding wallpaper 300 may include a protective layer 310, a conductive layer 320, and an adhesive layer 330. In a particular configuration, the conductive layer 320 is disposed between the protective layer 310 and the adhesive layer 330. The conductive layer 320 may have the same composition and properties as the conductive layer 110 as disclosed in FIG. 1, and the adhesive layer 330 may have the same composition and properties as the adhesive layer 120 also disclosed in FIG. 1. The protective layer 310 may be fabricated from a number of different types of polymers. For example, the protective layer 310 maybe fabricated from thermoplastic, thermoset, thermoplastic elastomer, elastomer, or ionomer. Even more specifically, the polymer of the protective layer 310 may be thermoplastic urethane, polypropylene, polyethylene, nylon 6, nylon 6,6, ethylene (meth) acrylic acid, or silicone. The protective layer 310 is advantageously coupled to the conductive layer so as to provide a puncture resistant top layer to resist damage and performance deterioration. In an embodiment, the protective layer 310 may be painted on, or have a pattern imprinted thereon. In this case, the need for a protective drywall layer or protective stud wall approach is eliminated.

Figure 4:
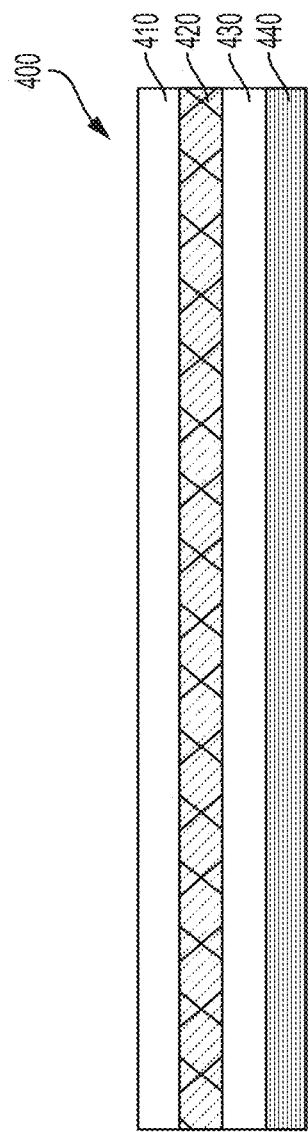
FIG. 4 shows a cross-sectional view of another embodiment of a shielding wallpaper according to the present disclosure.

FIG. 4 shows an embodiment of a shielding wallpaper 400 according to the present disclosure. The shielding wallpaper 400 may include a protective layer 410, a conductive layer 420, a fire retardant layer 430, and an adhesive layer 440. The protective layer 410 may have the same composition and properties as the protective layer 310 of FIG. 3, conductive layer 420 may have the same composition and properties as the conductive layer 110 of FIG. 1, fire retardant layer 430 may have the same composition and properties as the fire retardant layer 220 of FIG. 2, and the adhesive layer 440 may have the same composition and properties as the adhesive layer 120 of FIG. 1. In a particular configuration, the protective layer 410 is an outermost layer, and is disposed on top of the conductive layer 420. The conductive layer 420 is disposed on top of the fire retardant layer 430, which is disposed on top of the adhesive layer 440. It should be appreciated that while this particular configuration is disclosed as shown in FIG. 4, other configurations of layering is also possible. In a particular embodiment, the protective layer 410 is disposed on top of the conductive layer 420, while another protective layer (not shown) is disposed between the conductive layer 420 and the fire retardant layer 430. In yet another particular embodiment, the protective layer 410 is disposed on top of the conductive layer 420, while another protective layer is disposed between the fire retardant layer 430 and the adhesive layer 440. In these particular embodiments, conductive layer 420 is encapsulated within protective layers so as to provide a longer productive life cycle. The embodiment shown in FIG. 4 and the particular embodiments incorporate all of the benefits that each layer provides as discussed above.

Figure 5:
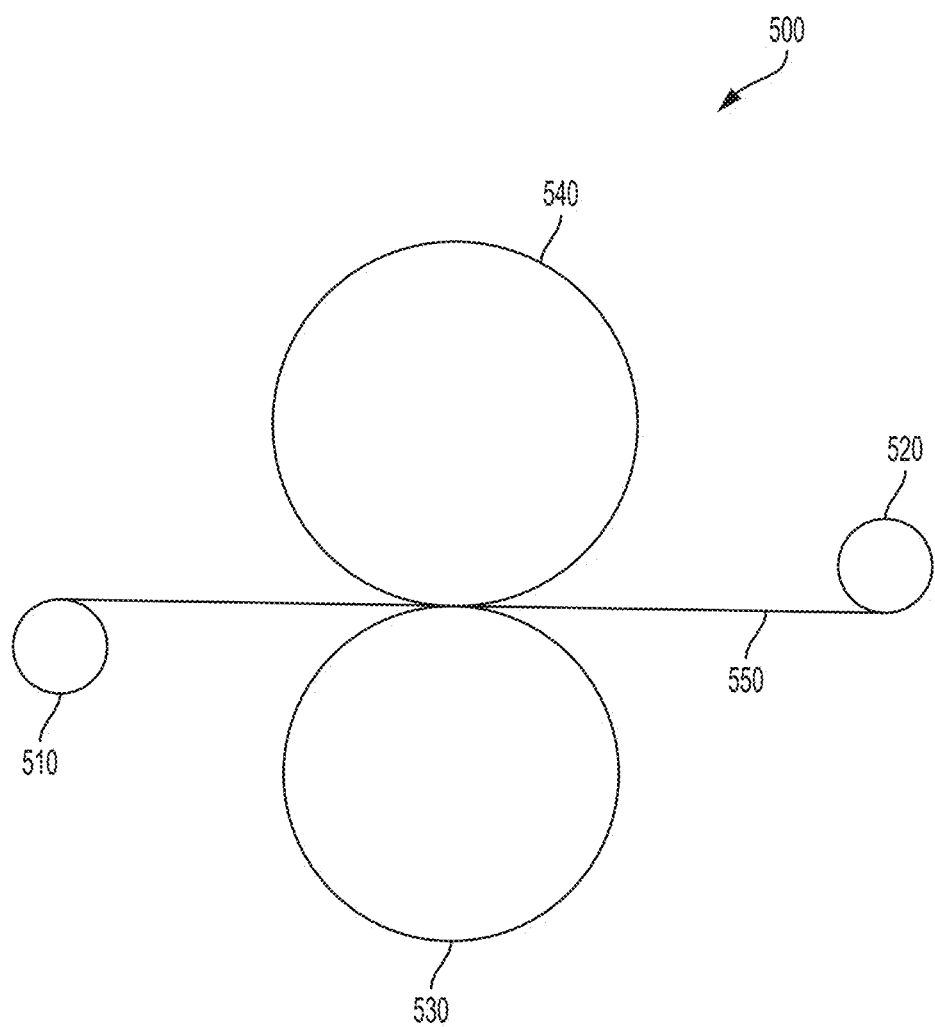
FIG. 5 shows a calendering apparatus by which conductive material may be manufactured.

FIG. 5 discloses a calendaring apparatus 500 by which the shielding wallpaper 100-400 may be manufactured. Calendering is a process by which a metal substrate is compressed into smaller thickness. To manufacture the shielding wallpaper 100 of FIG. 1, 200 of FIG. 2, 300 of FIG. 3, and 400 of FIG. 4, a conductive material 550 that will become the conductive layer (110, 210, 320 and 420 in FIGS. 1-4 respectively) is put through the calendering apparatus 500. The calendering apparatus 500 includes at least a top roller 540 and bottom roller 530 and a line speed control mechanism (not shown). During operation, conductive material 550 is fed from the unwind end of the calendering apparatus 500 from the unwind roller 510, through the rollers 540 and 530 by which nip pressure between the rollers 540 and 530 compress the thickness of the conductive material 550, and rewound at the end of the calendering apparatus 500 at the rewind roller 520. The rollers can be made of, but not limited to, ceramic, metal, and rubber materials. The rollers may be operated in different roller speeds while a nip pressure is controlled between the rollers 540 and 530 during operation. The calendering apparatus 500 may further include a heating control mechanism (not shown) to control the temperature of the rollers either individually or together. The operating parameter ranges for the calendering apparatus shown in table 1 below:

TABLE 1

| | |
|---|---|
| Controlled nip pressure | 0.001 to 1000 tons |
| Line speed control | 1 to 1000 linear yds./min |
| Tension control | 0.1 to 100 lbs |
| Roll temperature | 0 to 600° F. |

Since the conductive material 550 can vary in construction and composition, the degree to which calendering is beneficial will be dependent on the composition of the conductive base. Just like cold or hot rolling, the conductive material 550 can be passed through the process more than once, if desired. After the conductive material has completed the calendering process, the general benefits that should be observed are as follows: smaller conductive material pore size, smoother surface finish for a better surface conductivity and lower RF surface noise, and increased abrasion resistance. The calendering process' effect on abrasion resistance will be more clearly shown in FIG. 8 and its related disclosure.

The shielding wallpaper 100-400 as disclosed in FIGS. 1-4 provide high shielding performance, fire rating, and durability. Each embodiment may vary in thickness as needed for different applications. As an example, each of the shielding wallpapers 100-400 may be 0.001-0.25 inches thick. It should be also be noted that although FIGS. 1-4 appear to disclose that each of the disposed layers are of similar thickness, this is modifiable and each layer may be of different thickness as compared to each other. In other embodiments, multiple conductive layers may be disposed on any of the disclosed embodiments. For example, two or more conductive layers may over lay each other in place of any single conductive layer in any of the embodiments disclosed above. Alternatively, one conductive layer may include one or more layers of fabric or other material so as to produce the desired shielding effect. Even with varying numbers of layers and thickness, the shielding wallpaper provides conductive layer that is thinner and more conductive with increased RF performance and reduced RF surface noise. The thin conductive layer also reduces the amount of protective material needed to layer the conductive layer, and also reduces the thickness and weight of the shielding wallpaper. This overall thickness reduction in the conductive layer gives the product more flexibility and stretch ability for easier installment onto any surface.

In manufacturing the shielding wallpaper 300 and 400, protective layer 310 and 410 may be applied onto conductive layer 320 and 420 respectively, where a constant thickness of the protective layer 310 is applied throughout. Protective layers 310 and 410 may be applied to the conductive layer 320 and 420 by either laminating, casting, spraying, dipping, molding, or extruding.

Figure 6:
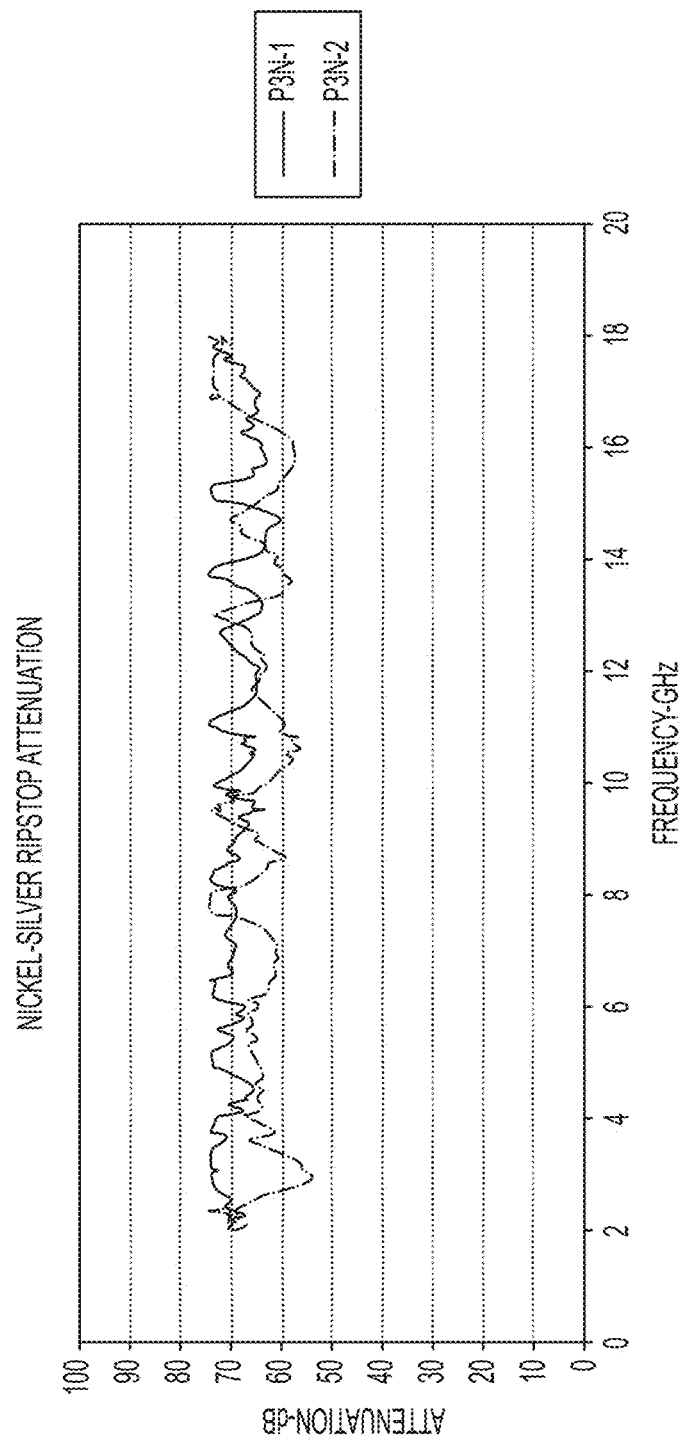
FIG. 6 shows an attenuation test data of two samples of shielding wallpaper according to the present disclosure.
Figure 7:
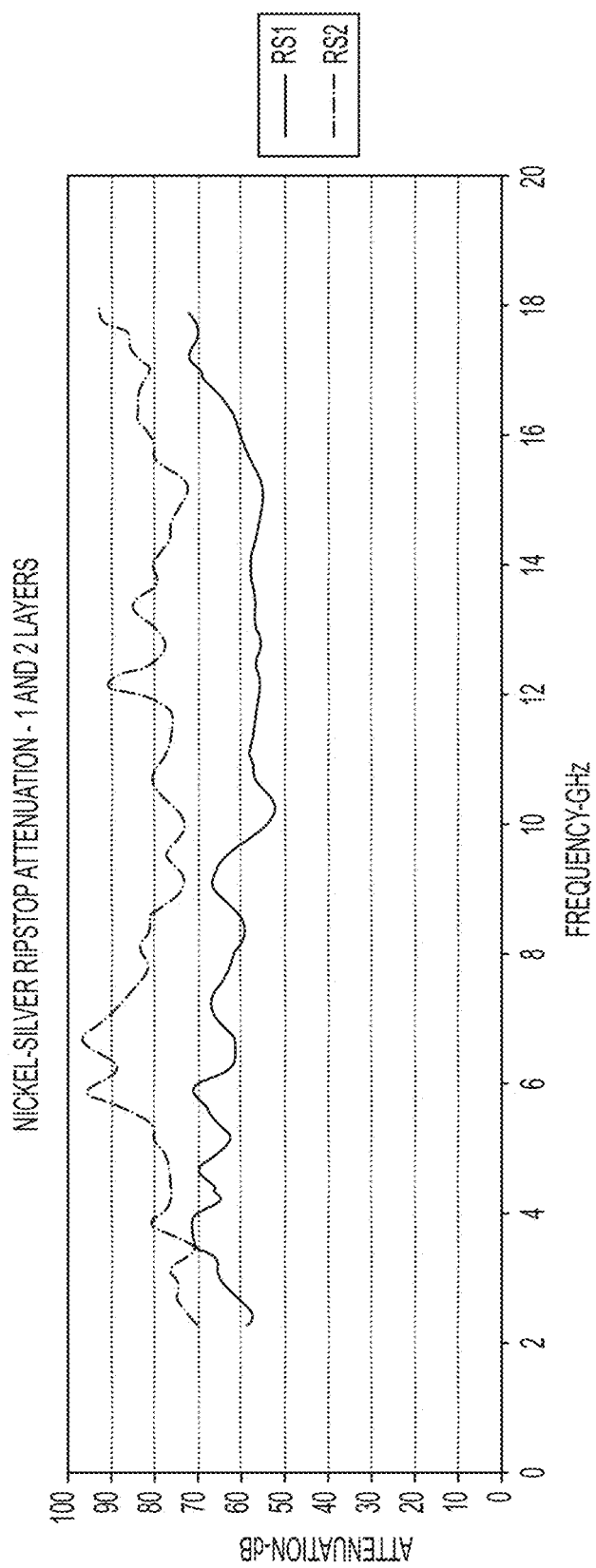
FIG. 7 shows an attenuation test data of two additional samples of shielding wallpaper according to the present disclosure.
Figure 8:
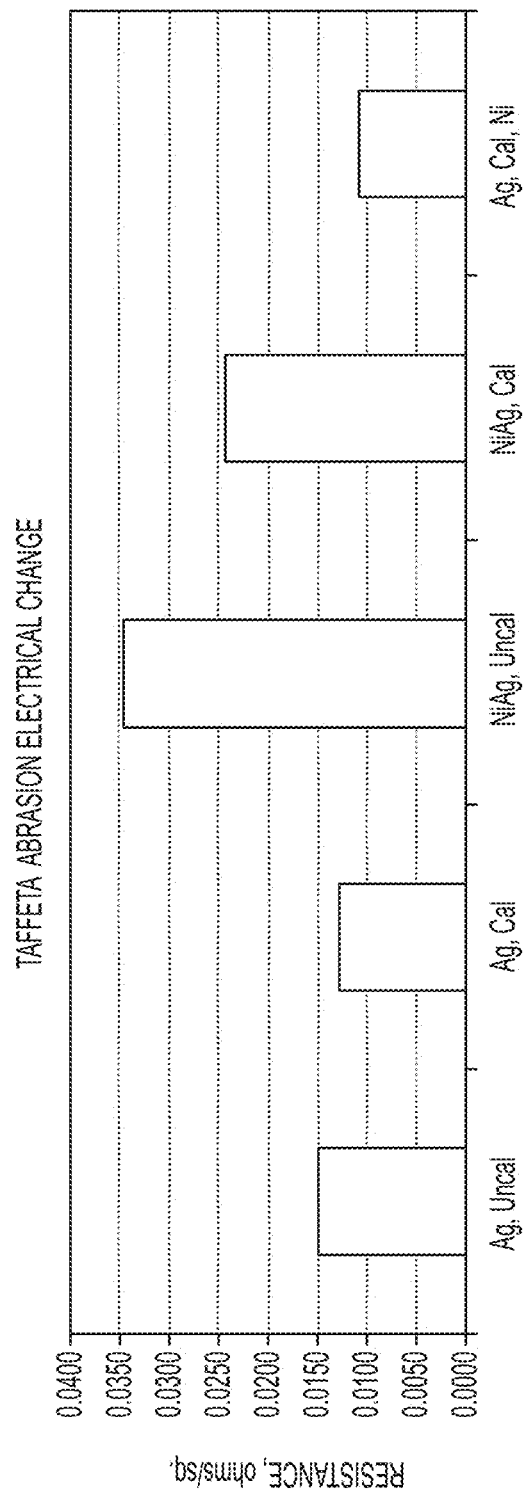
FIG. 8 shows an electrical resistance change test data of five samples of shielding wallpaper according to the present disclosure.

FIGS. 6-8 disclose test data of various embodiments of the shielding wallpaper disclosed above. FIG. 6 discloses an attenuation test on two samples of shielding wallpaper P3N-1 and P3N-2, where the conductive layer of each of the shielding wallpaper sample is a nickel-silver ripstop type fabric, where the conductive material of each conductive layer is nickel-silver. P3N-1 and P3N-2 are two samples of the same product line using the same conductive layer. As shown, both samples average between 60-75 dB of attenuation throughout testing by being exposed to electromagnetic waves of between 2 to 18 GHz.

FIG. 7 discloses an attenuation test on two samples of shielding wallpaper RS1 and RS2. The RS1 shielding wallpaper sample includes one layer of nickel-silver ripstop fabric as the conductive layer, and the RS2 shielding wallpaper sample includes two layers of nickel-silver ripstop fabric stacked on top of one another as the conductive layer. As shown, the RS1 sample achieves an attenuation of electromagnetic waves (between 2-18 GHz) of 50 to 75 dB, where as RS2 sample achieves an attenuation of 70 to 100 dB. This illustrates that having increased layers of conductive fabric as a conductive layer increases the shielding effectiveness of the wallpaper.

FIG. 8 discloses a taffeta abrasion chart, which illustrates electrical resistance as a function of abrasion and loss of metal of the conductive layer. An electrical resistance is measured in Ohms per square of the respective wallpaper sample. Data for five different sets of conductive material within the conductive layers are provided. For example, for a conductive layer using silver (Ag) as conductive material whereby the conductive layer was not calendered during the manufacture process (Uncal), an electrical resistance is approximately 0.015 Ohms per square. Comparatively, a conductive layer using silver (Ag) as conductive material whereby the conductive layer is calendered (Cal) during manufacture has an electrical resistance of approximately 0.0125-0.013 Ohms per square. Conductive layer using nickel silver (NiAg) as conductive material whereby the conductive layer was not calendered during the manufacture process (Uncal) has an electrical resistance of near 0.0350 Ohms per square. Comparatively, a conductive layer using NiAg as conductive material whereby the conductive layer is calendered during manufacture has an electrical resistance of close to 0.0240 Ohms per square. Lastly, an "Ag, Cal, Ni" type conductive layer has an electrical resistance of approximately 0.010 to 0.011 Ohms per square. It should be noted that the NiAg material discussed in reference to FIG. 8 is nickel and silver plated, and the "Ag, Cal, Ni" type conductive layer is produced by calendering a conductive layer having silver as conductive material, and applying a nickel plating to the conductive layer. This data shows and discloses an evaluation of the optimal combination of metals and surface condition for abrasion resistance.

While the shielding wallpaper has been described for use as wallpaper, it will be appreciated that this disclosure is not limited to wallpapers. For example, the products 100-400 disclosed in FIGS. 1-4 may also be used as elastomeric tapes that may be attached so any surface as appropriate. In addition, a protective liner may be disposed below the adhesive layer so that the wallpaper may more easily be transported.

The breadth and scope of the present disclosure should not be limited by any of the above-described exemplary embodiments, but should be defined only in accordance with the following claims and their equivalents. Moreover, the above advantages and features are provided in described embodiments, but shall not limit the application of the claims to processes and structures accomplishing any or all of the above advantages.

Additionally, the section headings herein are provided for consistency with the suggestions under 37 CFR 1.77 or otherwise to provide organizational cues. These headings shall not limit or characterize the invention(s) set out in any claims that may issue from this disclosure. Further, a description of a technology in the "Background" is not to be construed as an admission that technology is prior art to any invention(s) in this disclosure. Neither is the "Brief Summary" to be considered as a characterization of the invention(s) set forth in the claims found herein. Furthermore, any reference in this disclosure to "invention" in the singular should not be used to argue that there is only a single point of novelty claimed in this disclosure. Multiple inventions may be set forth according to the limitations of the multiple claims associated with this disclosure, and the claims accordingly define the invention(s), and their equivalents, that are protected thereby. In all instances, the scope of the claims shall be considered on their own merits in light of the specification, but should not be constrained by the headings set forth herein.

The invention claimed is:

1. A wallpaper, comprising:
   a conductive layer having a base material and a conductive material;
   an adhesive layer including an adhesive material selected from a group consisting of acrylic, rubber cement, polyurethane, epoxy, and silicone based adhesives;
   a fire retardant layer disposed between the conductive layer and the adhesive layer, wherein the fire retardant layer includes an organohalogen or organophosphorus material,
   wherein the conductive layer is calendered through a first roller and a second roller.

2. The wallpaper of claim 1 further comprising
   a protective layer, wherein the protective layer is disposed on the conductive layer.

3. The wallpaper of claim 2, wherein the protective layer includes a protective material selected from a group consisting of thermoplastic polyurethane, polypropylene, polyethylene, nylon 6, nylon 66, ethylene (meth) acrylic acid, and silicone.

4. The wallpaper of claim 1, wherein the base material is selected from a group consisting of nylon 6, nylon 66, polyester, polyethylene, polyurethane, and carbon fiber.

5. The wallpaper of claim 1, wherein the conductive material is selected from a group consisting of conductive polymers, metals, alloys, carbon, and metal oxides.

6. The wallpaper of claim 1, wherein the conductive material is silver, and the conductive layer is plated with nickel after the conductive layer is calendered.

7. A wallpaper, comprising:
a conductive layer having a base material and a conductive material; and
an adhesive layer including an adhesive material selected from a group consisting of acrylic, rubber cement, polyurethane, epoxy, and silicone based adhesives,
a fire retardant layer disposed between the conductive layer and the adhesive layer, and
a protective layer disposed on the conductive layer,
wherein the fire retardant layer includes an organophorous material and the protective layer includes a protective material selected from a group consisting of thermoplastic urethane, polypropylene, polyethylene, nylon 6, nylon 66, ethylene (meth) acrylic acid, and silicone.

8. A shielding wallpaper, comprising:
a conductive layer having a base material and a conductive material, wherein the conductive material is nickel-silver;
a protective layer disposed on a first side of the conductive layer;
a fire retardant layer disposed on a second side of the conductive layer; and
an adhesive layer disposed on the fire retardant layer.

9. The shielding wallpaper of claim 8, wherein the conductive layer is calendered through a first roller and a second roller.

10. The shielding wallpaper of claim 8, wherein the shielding wallpaper is between 0.001 to 0.25 inches thick.

11. The shielding wallpaper of claim 8, wherein the base material is selected from a group consisting of nylon 6, nylon 6,6, polyester, polyethylene, polyurethane, and carbon fiber.

12. The shielding wallpaper of claim 8, wherein the conductive material is selected from a group consisting of conductive polymers, metals, alloys, carbon, and metal oxides.

13. The shielding wallpaper of claim 8, further comprising a liner disposed on the adhesive layer.

14. The shielding wallpaper of claim 8, wherein the protective layer includes a protective material selected from a group consisting of thermoplastic urethane, polypropylene, polyethylene, nylon 6, nylon 6,6, ethylene (meth) acrylic acid, and silicone.

15. A method of manufacturing a shielding wallpaper to include:
providing a conductive layer having a base material and a conductive material;
calendering the conductive layer through a first calendering roller and a second calendering roller;
providing an adhesive layer having an adhesive material selected from a group of acrylic, rubber cement, polyurethane, epoxy, and silicone based adhesives;
plating the calendered conductive layer with a metal; and
disposing a protective layer on top of the conductive layer after said plating and said calendering.

16. The method of claim 15, further comprising
disposing a fire retardant layer between the conductive layer and the adhesive layer.

* * * * *